(12) United States Patent
Matsuyama et al.

(10) Patent No.: US 6,603,875 B1
(45) Date of Patent: Aug. 5, 2003

(54) PATTERN INSPECTION METHOD, PATTERN INSPECTION APPARATUS, AND RECORDING MEDIUM WHICH RECORDS PATTERN INSPECTION PROGRAM

(75) Inventors: Takayoshi Matsuyama, Kawasaki (JP); Ituo Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/525,019

(22) Filed: Mar. 14, 2000

(30) Foreign Application Priority Data

May 31, 1999 (JP) ............................................ 11-152941

(51) Int. Cl.[7] .............................. G06K 9/00; G03C 5/00
(52) U.S. Cl. ........................................ 382/145; 430/311
(58) Field of Search .................................. 382/149, 145, 382/141, 144, 146–148, 150–151; 438/18; 430/30, 311, 312, 5

(56) References Cited

U.S. PATENT DOCUMENTS

| | | | | |
|---|---|---|---|---|
| 4,587,617 A | * | 5/1986 | Barker et al. | 382/149 |
| 4,953,224 A | * | 8/1990 | Ichinose et al. | 382/149 |
| 5,900,941 A | * | 5/1999 | Matsuyama et al. | 356/394 |

FOREIGN PATENT DOCUMENTS

| | | | | |
|---|---|---|---|---|
| JP | 58-9009 | | 1/1983 | ........... G01B/11/24 |
| JP | 59168312 A | * | 9/1984 | ........... G01B/11/24 |
| JP | 01121709 A | * | 5/1989 | ........... G01B/11/24 |
| JP | 5-60536 | | 3/1993 | ........... G01B/11/24 |

* cited by examiner

*Primary Examiner*—Wenpeng Chen
(74) *Attorney, Agent, or Firm*—Staas & Halsey LLP (57) ABSTRACT

A pattern inspection method and apparatus for carrying out pattern inspection with a simple mechanical apparatus following a simple procedure are provided. A recording medium which records a pattern inspection program for carrying out the pattern inspection is also provided. The pattern inspection apparatus of the present invention includes: a first image data generator which generates first image data from a pattern image captured from a sample; a second image data generator which generates second image data by reducing the four sides of each pattern contained in the first image data; a pattern number detector which detects a first pattern number that is the number of patterns contained in the first image data, and also detects a second pattern number that is the number of patterns contained in the second image data; and a defect detector which detects a defect contained in the patterns of the sample in accordance with a result of the comparison between the first pattern number and the second pattern number.

9 Claims, 10 Drawing Sheets

PATTERN INSPECTION METHOD, PATTERN INSPECTION APPARATUS, AND RECORDING MEDIUM WHICH RECORDS PATTERN INSPECTION PROGRAM

BACKGROUND OF THE INVENTION

1. Field of the Invention

The present invention generally relates to pattern inspection methods, and pattern inspection apparatuses, and recording media which store pattern inspection programs. More particularly, the present invention relates to a pattern inspection method and a pattern inspection apparatus for pattern inspection by the use of an electro-optical system, and a recording medium which records a pattern inspection program.

As pattern designs on printed wiring boards or photomasks have been rapidly improved by programs such as a CAD (Computer Aided Design) program, pattern inspection has been becoming more and more important, because of the increasing difficulties in guaranteeing high quality and high performance. There are two types of pattern inspection methods: one is a continuity inspection type, and the other is a visual inspection type.

As a conventional pattern inspection method of the visual inspection type, there is a die-to-die inspection technique for carrying out pattern inspection by comparing two neighboring chips (dies). Also, there is a die-to-database inspection technique for carrying out pattern inspection by comparing a chip with design data.

2. Description of the Related Art

Figure 1:
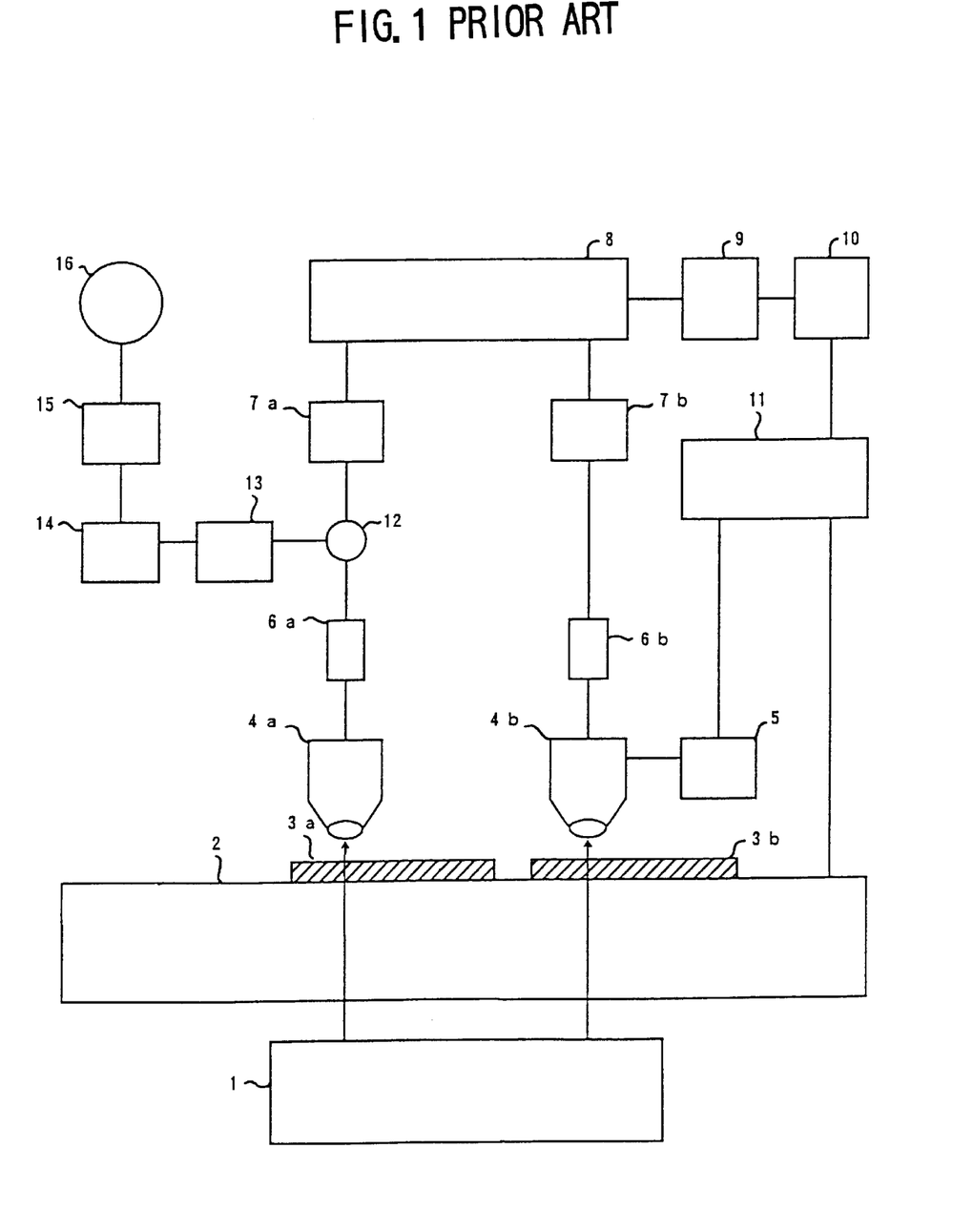
FIG. 1 is a block diagram of a die-to-die pattern inspection apparatus and a die-to-database pattern inspection apparatus of the prior art.
Figure 2:
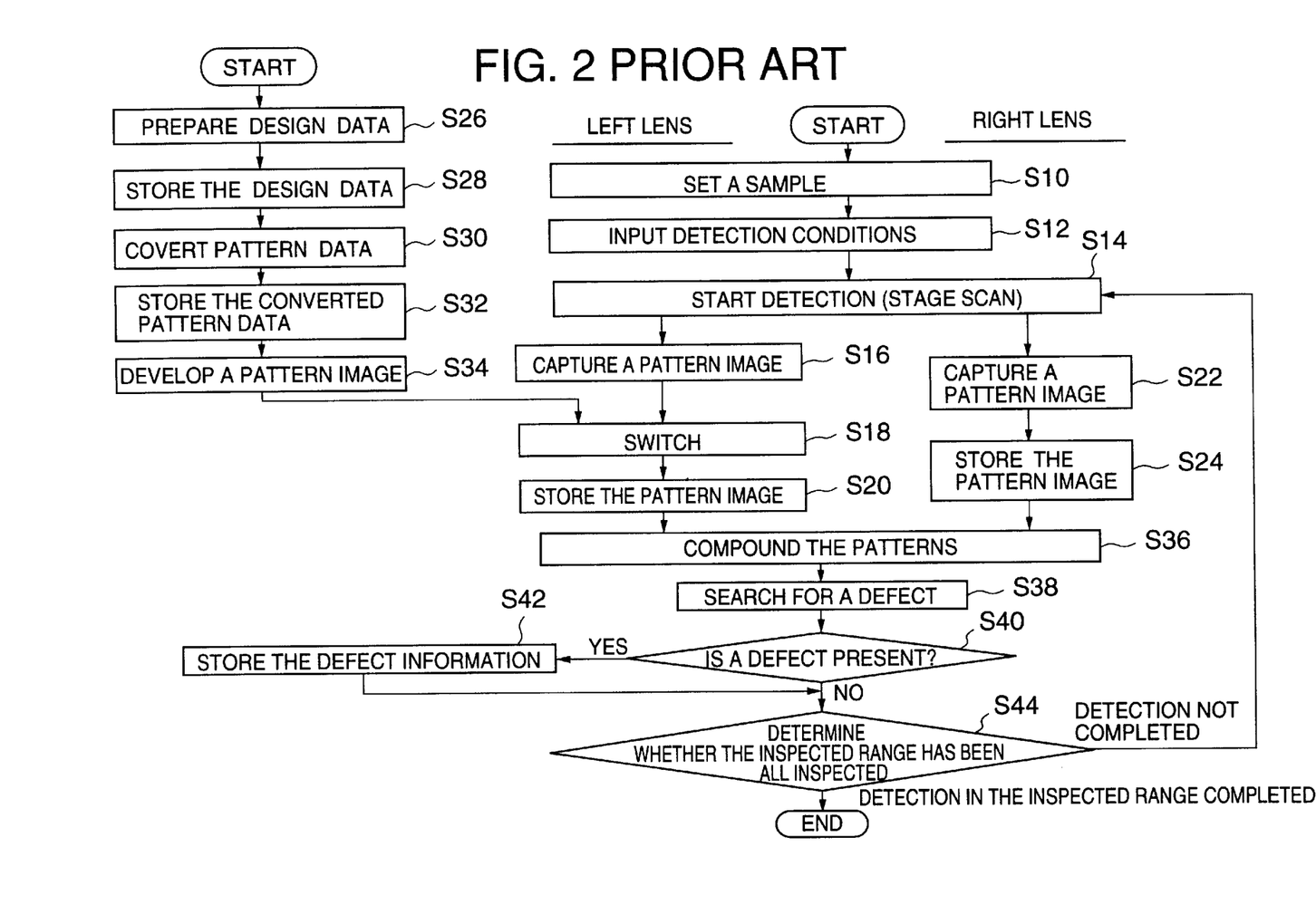
FIG. 2 is a flowchart of operation procedures of the apparatuses shown in FIG. 1.

FIG. 1 is a block diagram of a die-to-die pattern inspection apparatus and a die-to-database pattern inspection apparatus. FIG. 2 is a flowchart of operations of the apparatuses shown in FIG. 1.

The apparatus comprises two optical detectors (objectives) 4a and 4b. The optical detector 4a and a light receiving member 6a capture the image data of a chip 3a (step S16), and the optical detector 4b and a light receiving member 6b capture the image data of a chip 3b to be inspected (step S22). The captured data of the chip 3a is stored in an image memory 7a (step S20), while the captured image data of the chip 3b is stored in an image memory 7b (step S24). Here, the optical detectors 4a and 4b are situated in such positions that they can simultaneously scan the image data at the same locations on the chips 3a and 3b.

The above process is the image data capturing process in the die-to-die pattern inspection. In the case of the die-to-database pattern inspection, on the other hand, a data conversion unit 14 converts design data 16 into image data (step S30), and the converted data, instead of the image data captured by the optical detector 4a and the light receiving member 6a, is stored in the image memory 7a (step S20).

In both cases of the die-to-die pattern inspection and the die-to-database pattern inspection, a pattern compound circuit 8 compares the image data stored in the image memory 7a with the image data stored in the image memory 7b (step S36), and supplies the comparison result to a defect detecting circuit 9. In accordance with the comparison result, the defect detecting circuit 9 detects defects (step S38).

Figure 3:
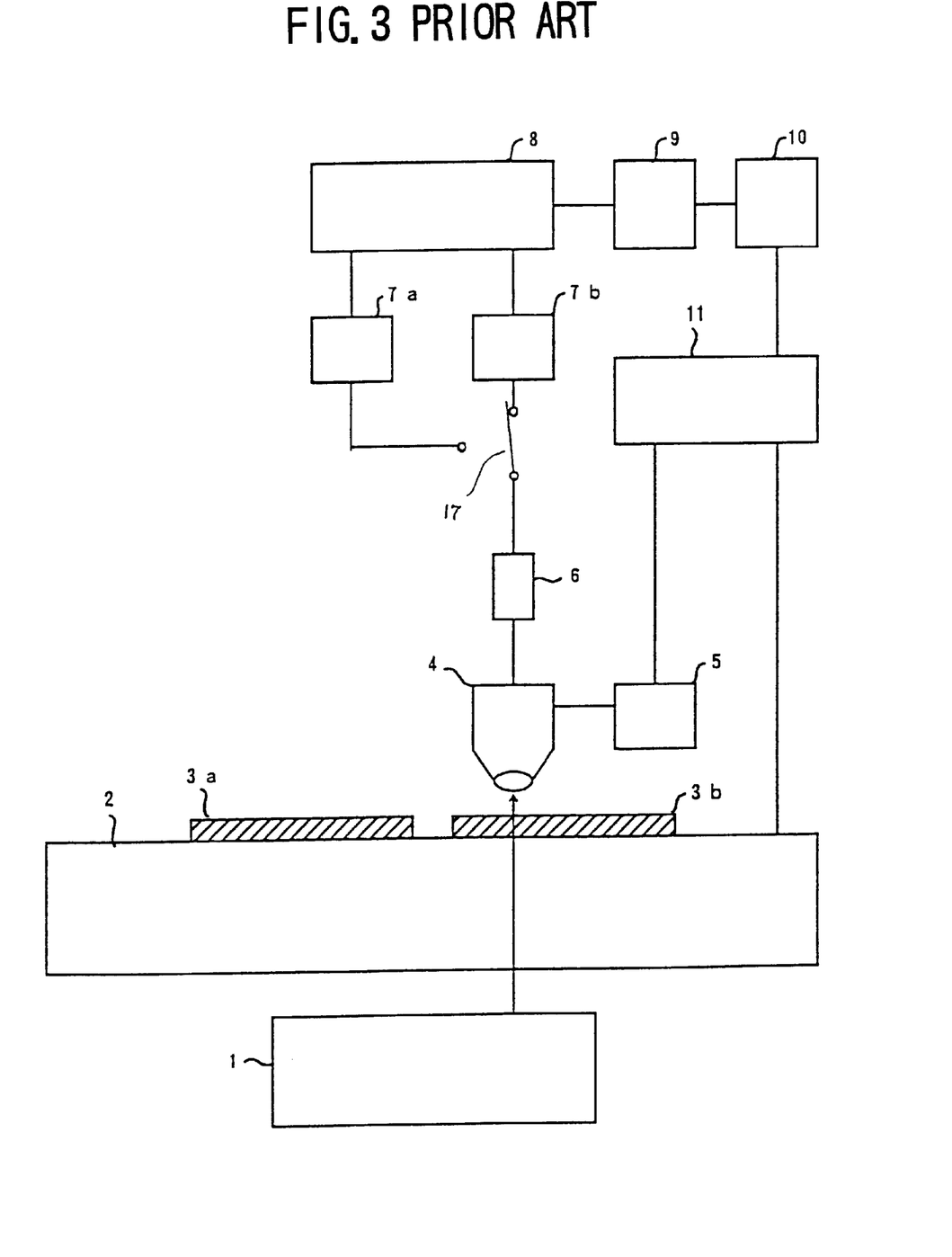
FIG. 3 is a block diagram of another die-to-die pattern inspection apparatus of the prior art.
Figure 4:
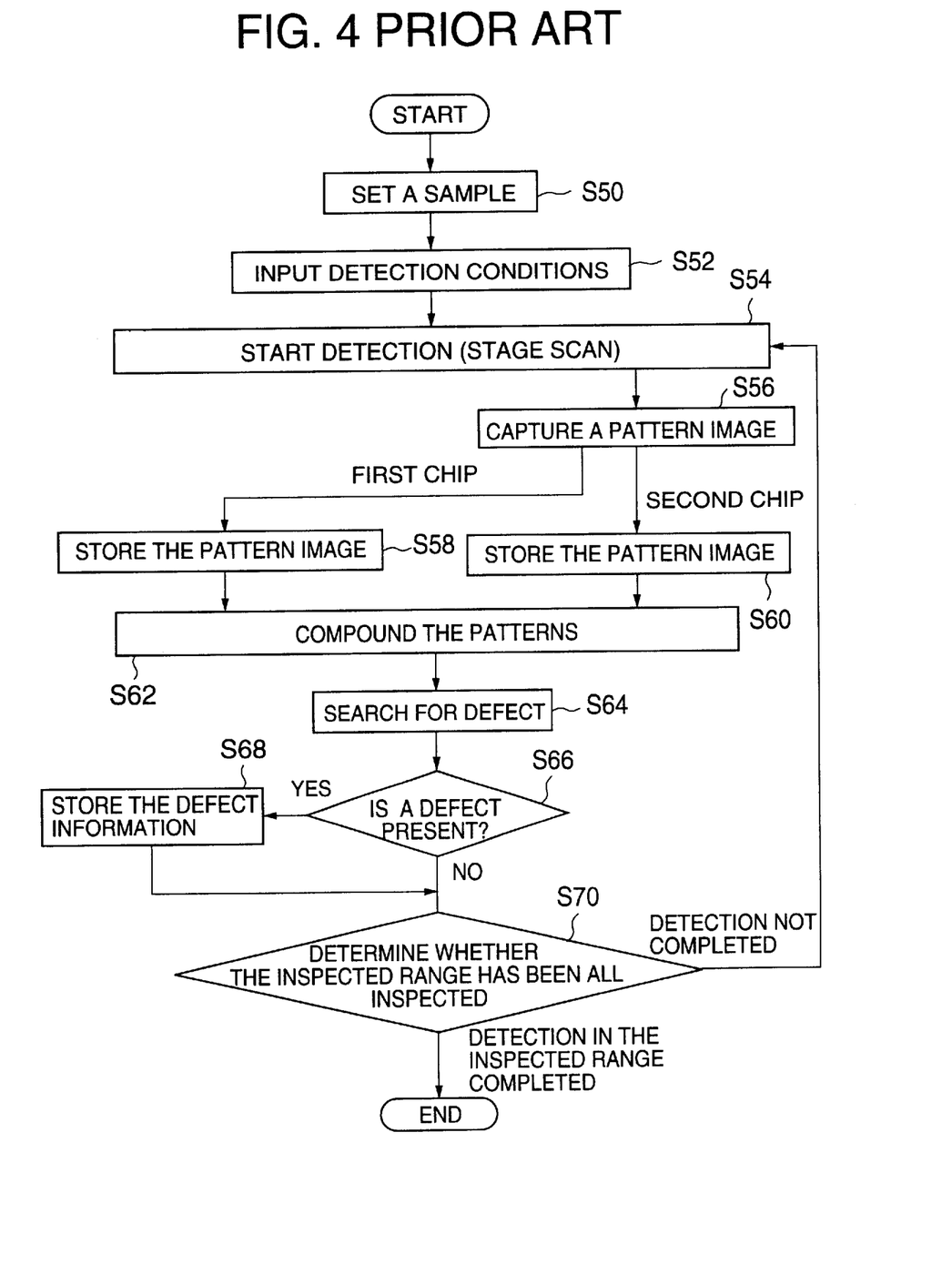
FIG. 4 is a flowchart of an operation procedure of the apparatus shown in FIG. 3.

Although the apparatuses shown in FIG. 1 have the two optical detectors 4a and 4b, it is also possible to employ only one optical detector in the die-to-die pattern inspection. FIG. 3 is a block diagram of another die-to-die pattern inspection apparatus. FIG. 4 is a flowchart of the apparatus of FIG. 3.

In these figures, the same components as in FIGS. 1 and 2 are denoted by the same reference numerals.

The apparatus of FIG. 3 has an optical detector (an objective) 4. The optical detector 4 and a light receiving member 6 capture the image data of the chip 3a (step S56). A switch 17 is then connected to the image memory 7a so as to store the image data of the chip 3a in the image memory 7a (step S58). The optical detector 4 and a light receiving member 6 capture the image data of the other chip 3b (step S56). This time, the switch 17 is connected to the image memory 7b so as to store the image data of the chip 3B in the image memory 7b (step S60).

The pattern compound circuit 8 then compares the image data stored in the image memory 7a with the image data stored in the image memory 7b (step S62), and supplies the comparison result to the defect detecting circuit 9. In accordance with the comparison result, the defect detecting circuit 9 detects defects (step S64).

Figure 5:
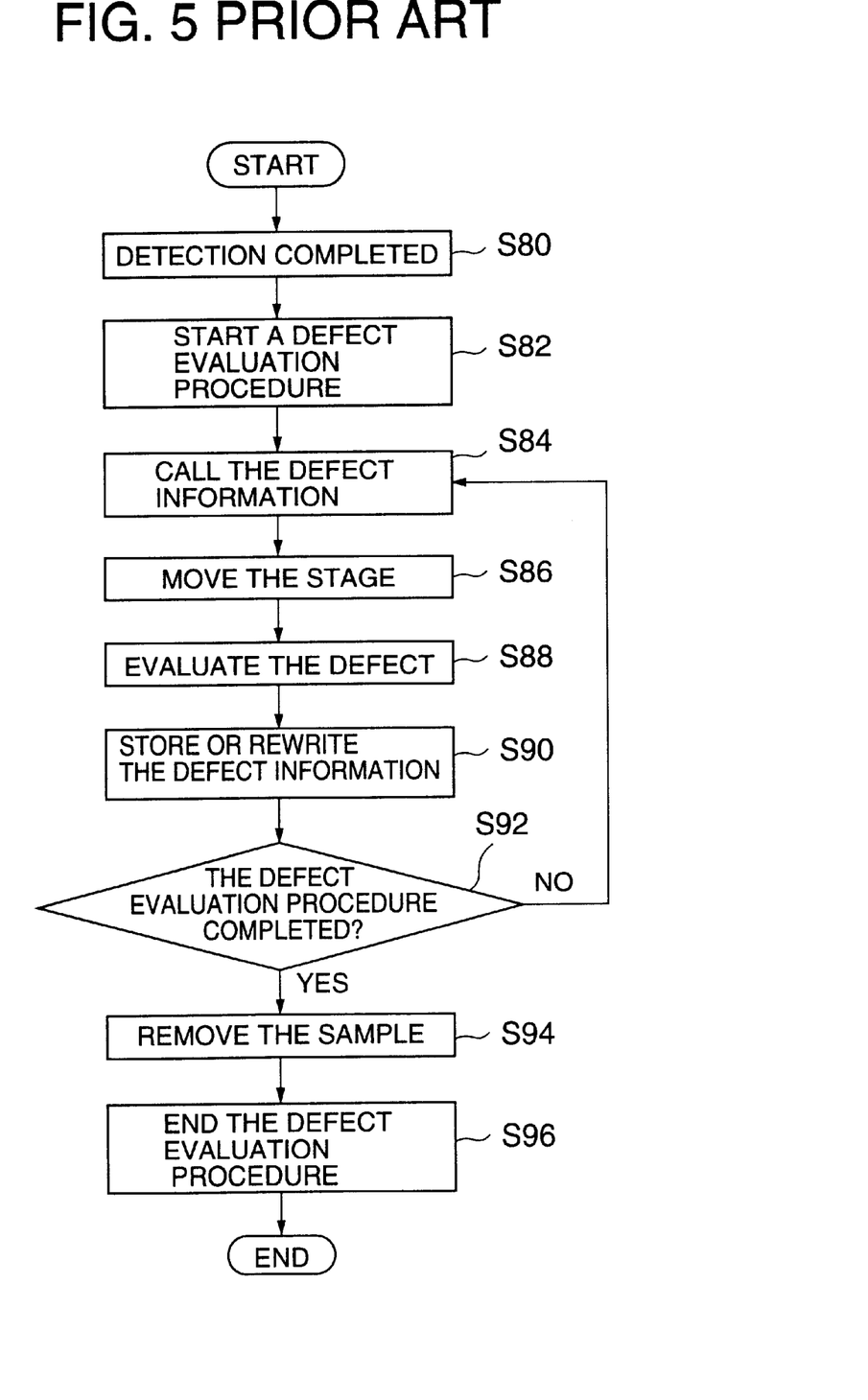
FIG. 5 is a flowchart of a defect evaluation procedure of the prior art.

Each of the defects detected as shown in the flowcharts of FIGS. 2 and 4 is checked by visual inspection. FIG. 5 is a flowchart of the defect evaluation procedure.

After the defect detection is completed, the detected defects are read out of a defect information memory 10 one by one (step S84), and the read-out information is processed so that the position of each defect can be visually seen (step S86). For instance, the defective point is enlarged and displayed.

A user evaluates the defects one by one, and determines whether the defect is a false defect that is allowable (step S88). The false defects are not pattern disconnection or short circuits, but are differences between the design data and each chip. For instance, the round corners of patterns formed on a chip represent such differences.

If the defect is determined to be a false defect, the defect information corresponding to the defect is rewritten (step S90). This process is carried out for every detected defect, so that false defects are eliminated from the final defect data set.

In the die-to-die pattern inspection using the apparatus shown in FIG. 1, however, the two optical detectors 4a and 4b complicate the structure, resulting in high production costs. The die-to-die pattern inspection using the apparatus shown in FIG. 3 also has a problem that a large-capacity image memory is required, which also results in high production costs.

In the die-to-database pattern inspection, it is necessary to prepare the design data and convert the design data into image data for inspection. This data conversion takes a very long time and results in poor operation efficiency.

In any of the above inspections, pattern images should be accurately compared, and therefore a high-precision apparatus is required.

Furthermore, patterns formed on a chip normally have round corners, and cannot be compared with the image data converted from the design data. To perform proper comparisons, the round corners need to be adjusted for. However, it is difficult to process adjustments for the round corners, because such a process often leads to wrong detection and many false defects. To avoid the wrong detection, the defect evaluation procedure shown in FIG. 5 is needed in order to evaluate defect information containing false defect information so as to eliminate the false defects from the final defect data set. However, the defect evaluation procedure takes a very long time, and the visual evaluation often reduces inspection reliability.

SUMMARY OF THE INVENTION

A general object of the present invention is to provide pattern inspection methods, pattern inspection apparatuses, and recording media which store pattern inspection programs, in which the above disadvantages are eliminated.

A more specific object of the present invention is to provide a pattern inspection method and a pattern inspection apparatus, by which pattern inspection is carried out with a simpler mechanical configuration following a simpler procedure. Another specific object of the present invention is to provide a recording medium which records a pattern inspection program for carrying out pattern inspection by the above pattern inspection method or the above pattern inspection apparatus.

The above objects of the present invention are achieved by a pattern inspection method which comprises the steps of:

generating first image data from a pattern image captured from a sample;

obtaining a first pattern number which is the number of patterns contained in the first image data;

generating second image data by reducing the four sides of each pattern contained in the first image data by a predetermined width;

obtaining a second pattern number which is the number of patterns contained in the second image data; and detecting a defect in the patterns of the sample in accordance with a result of comparison between the first pattern number and the second pattern number.

According to the above method, a defect contained in the pattern of the sample is detected based on the result of comparison between the number of patterns contained in the first image data and the number of patterns contained in the second image data. This is simpler than a conventional defect detection technique of detecting a defect by comparing the image data of two samples. Accordingly, pattern defect detection can be carried out with a simpler mechanical configuration following a simpler procedure.

Also, the pattern inspection method of the present invention does not include the conventionally required step of eliminating false defects. Thus, operation efficiency can be improved.

The above objects of the present invention are also achieved by a pattern inspection apparatus which comprises: a first image data generator which generates first image data from a pattern image captured from a sample; a second image data generator which generates second image data by reducing the four sides of each pattern contained in the first image data by a predetermined width; a pattern number detector which detects a first pattern number that is the number of patterns contained in the first image data, and which also detects a second pattern number that is the number of patterns contained in the second image data; and a defect detector which detects a defect present in the patterns of the sample in accordance with a result of comparison between the first pattern number and the second pattern number.

The above objects of the present invention are also achieved by a computer-readable recording medium in which a program is recorded, the program providing a computer with functions of: a first image data generator which generates first image data from a pattern image captured from a sample; a second image data generator which generates second image data by reducing the four sides of each pattern contained in the first image data by a predetermined width; a pattern number detector which detects a first pattern number that is the number of patterns contained in the first image data, and which also detects a second pattern number that is the number of patterns contained in the second image data; and a defect detector which detects a defect present in the patterns of the sample in accordance with a result of comparison between the first pattern number and the second pattern number.

By the use of the above recording media, the pattern inspection method and apparatus of the present invention can be realized.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 6A:
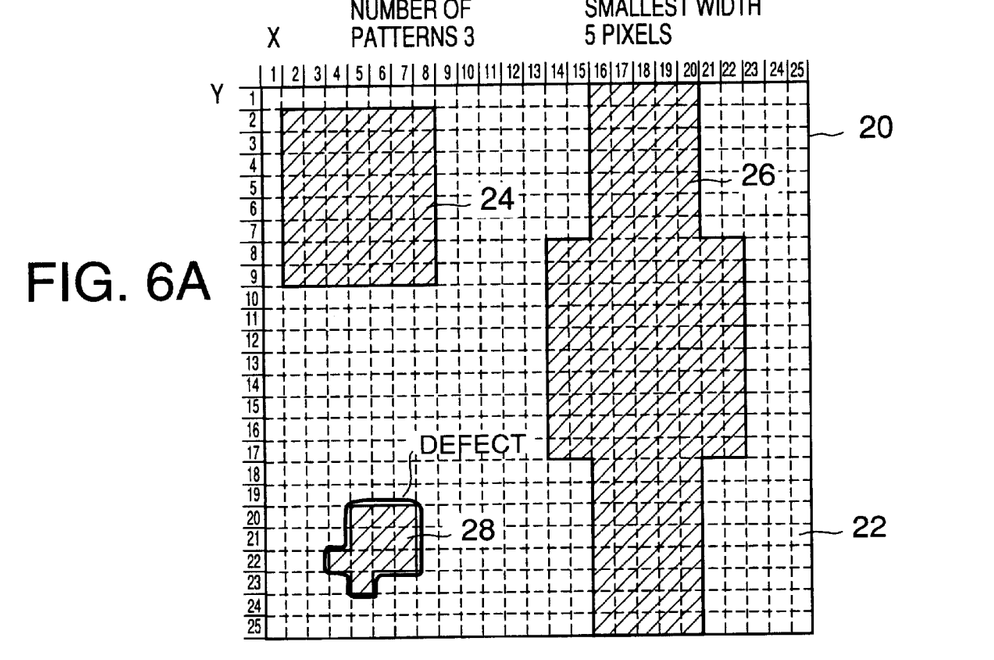
FIGS. 6A and 6B show an isolated defect detected in image data through pattern inspection in accordance with the present invention.
Figure 6B:
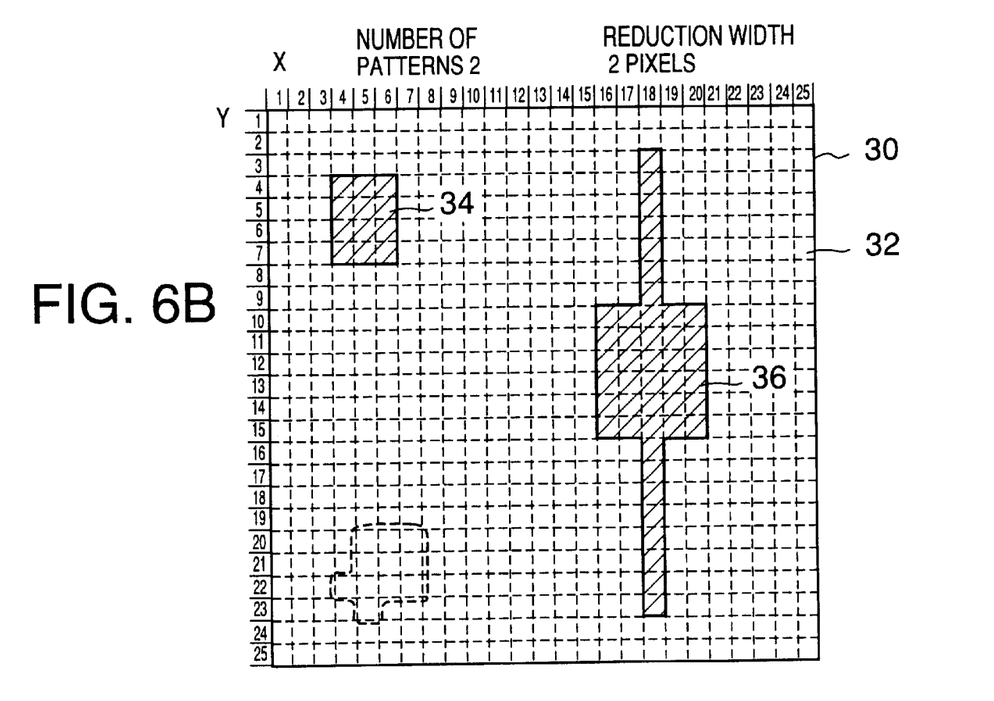

Referring first to FIG. 6, inspection of an isolated defect will be explained. FIG. 6A shows the image data representing a part of a chip to be inspected, and FIG. 6B shows the image data after the pattern inspection in accordance with the present invention.

In FIGS. 6A and 6B, there are white patterns and black patterns. The present invention is applicable to both white patterns and black patterns. It is possible to decide which patterns are to be inspected using a preliminary condition setting prior to the inspection. Both white patterns and black patterns can be inspected by inspecting the white patterns in a first scan and the black patterns in a second scan. Since the pattern inspecting operation is the same for both white patterns and black patterns, only the inspecting operation on the black patterns will be explained below.

Image data 20 in FIG. 6A represents a part of a chip to be inspected. The image data 20 has a matrix structure made up of 25×25 pixels. Each pixel 22 represents the smallest possible size recognized by a light receiving member which captures the image data 20.

The image data 20 contains three patterns 24, 26, and 28. The patterns 24 and 26 are normal patterns, while the pattern 28 is an abnormal pattern, i.e., it contains a defect.

The three patterns 24, 26, and 28 are then reduced in size by a predetermined reduction width. This reduction width is determined by the smallest pattern width on the chip to be inspected, and is represented by a pixel number, for instance. When reduced by the predetermined reduction width, a normal pattern will not disappear, or vanish, from the image data 20.

Image data 30 in FIG. 6B is the image data 20 after the four sides of each of the patterns 24, 26, and 28 are reduced by 2 pixels. The image data 30 includes two patterns 34 and 36. As a result of the reduction of the patterns included in the image data 20, the pattern 28 has vanished from the image data 30. Accordingly, the difference between the number of patterns in the image data 20 prior to the pattern reduction and the number of patterns in the image data 30 after the pattern reduction indicates that a defect is present in the image data 20.

Figure 7A:
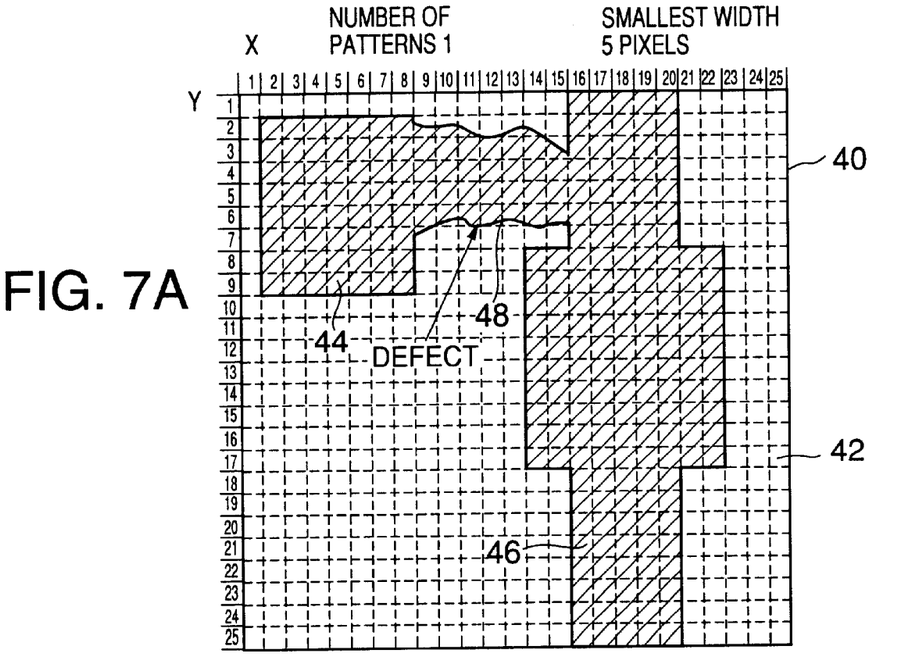
FIGS. 7A and 7B show a short-circuit or disconnection defect detected in image data through the pattern inspection in accordance with the present invention.
Figure 7B:
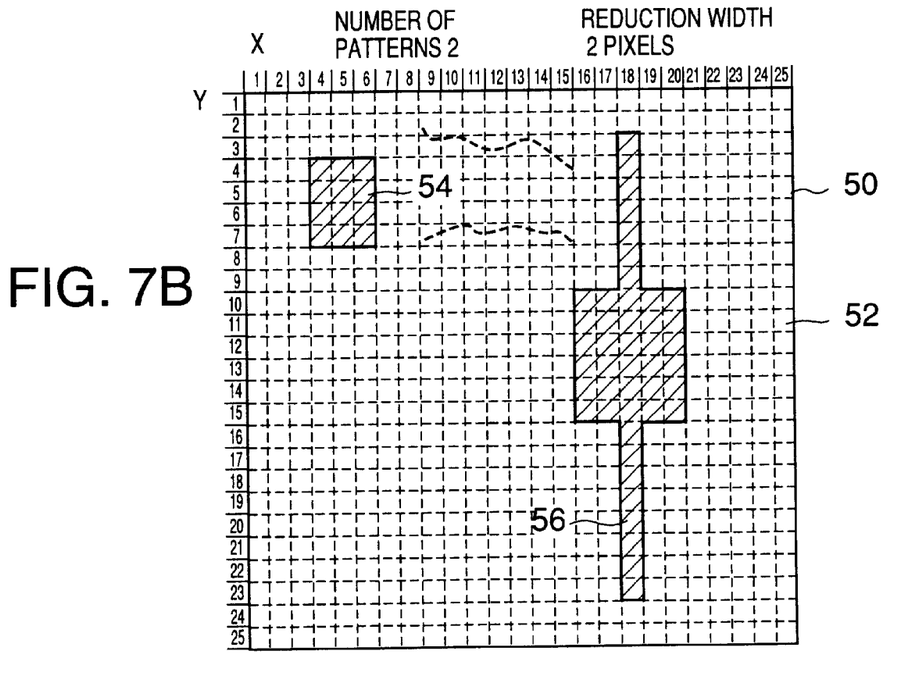

FIGS. 7A and 7B show a pattern inspecting operation in a case of a short-circuit or disconnection defect. FIG. 7A shows the image data representing a part of a chip to be inspected, and FIG. 7B shows the image data after the pattern inspection in accordance with the present invention.

Image data 40 in FIG. 7A is captured from a part of a chip to be inspected, and has a single pattern formed by two patterns 44 and 46 short-circuited by an abnormal pattern portion 48.

After the single pattern in the image data 40 is reduced by 2 pixels at each side, the single pattern shown in FIG. 7A is divided into two patterns 54 and 56. The abnormal pattern portion 48 is made to vanish by the pattern reduction. Accordingly, the difference between the number of patterns in the image data 40 prior to the pattern reduction and the number of patterns in the image data 50 after the pattern reduction indicates that a defect is present in the image data 40.

Figure 8A:
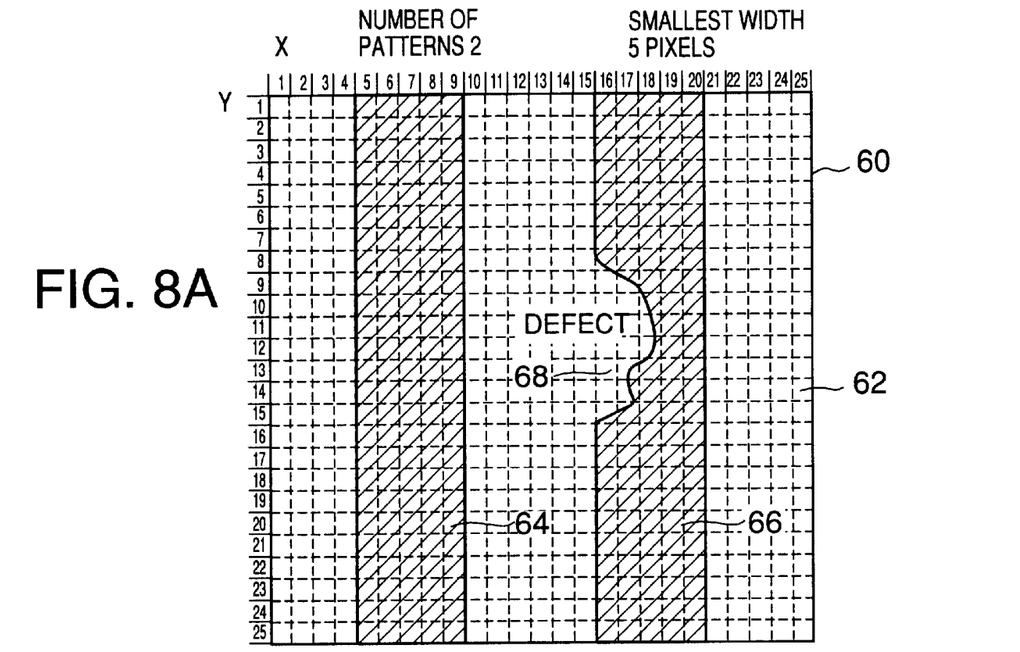
FIGS. 8A and 8B show an edge defect detected in image data through the pattern inspection in accordance with the present invention.
Figure 8B:
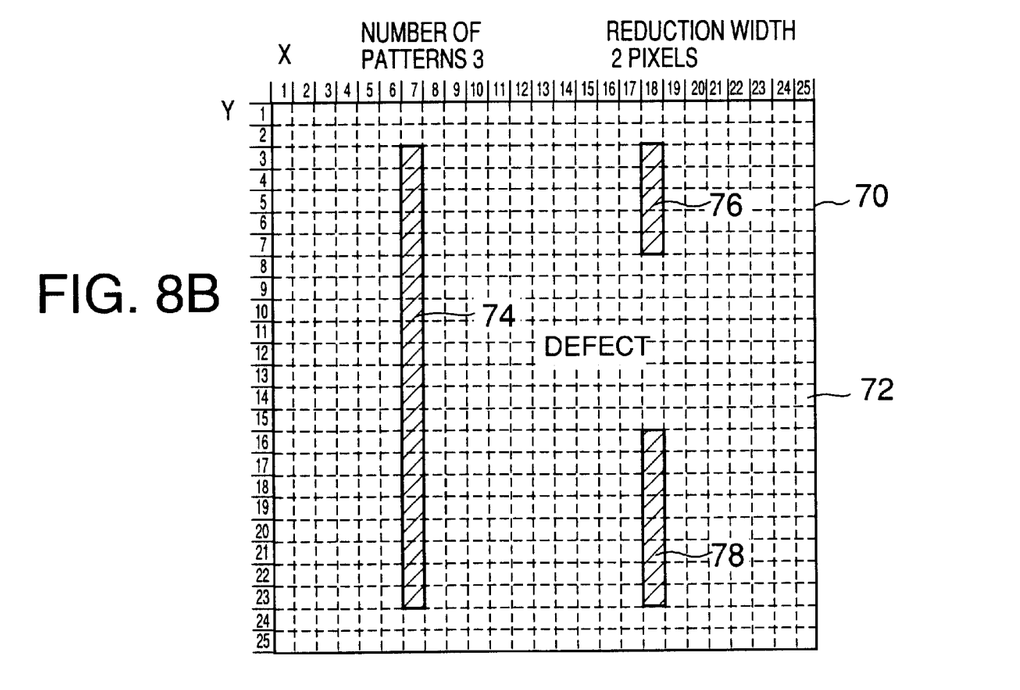

FIGS. 8A and 8B show a pattern inspecting operation in a case of an edge defect. FIG. 8A shows the image data representing a part of a chip to be inspected, and FIG. 8B shows the image data after the pattern inspection in accordance with the present invention.

Image data 60 in FIG. 8A is captured from a part of a chip to be inspected, and has two patterns 64 and 66. The pattern 66 contains an abnormal pattern portion 68.

After the two patterns 64 and 66 are reduced by 2 pixels at each side, the two patterns 64 and 66 shown in FIG. 8A turn into three patterns 74, 76, and 78 shown in image data 70 of FIG. 8B. More specifically, the abnormal pattern portion 68 is vanished by the reduction of the pattern 66 contained in the image data 60, and the pattern 66 turns into the two patterns 76 and 78. Accordingly, the difference between the number of patterns in the image data 60 prior to the pattern reduction and the number of patterns in the image data 70 after the pattern reduction indicates that a defect is present in the image data 60.

In the above manner, patterns contained in image data are reduced by a reduction width predetermined by the smallest pattern width, and whether a defect is present in the image data is determined by comparing the number of patterns in the image data prior to the pattern reduction and the number of patterns in the image data after the pattern reduction.

Figure 9:
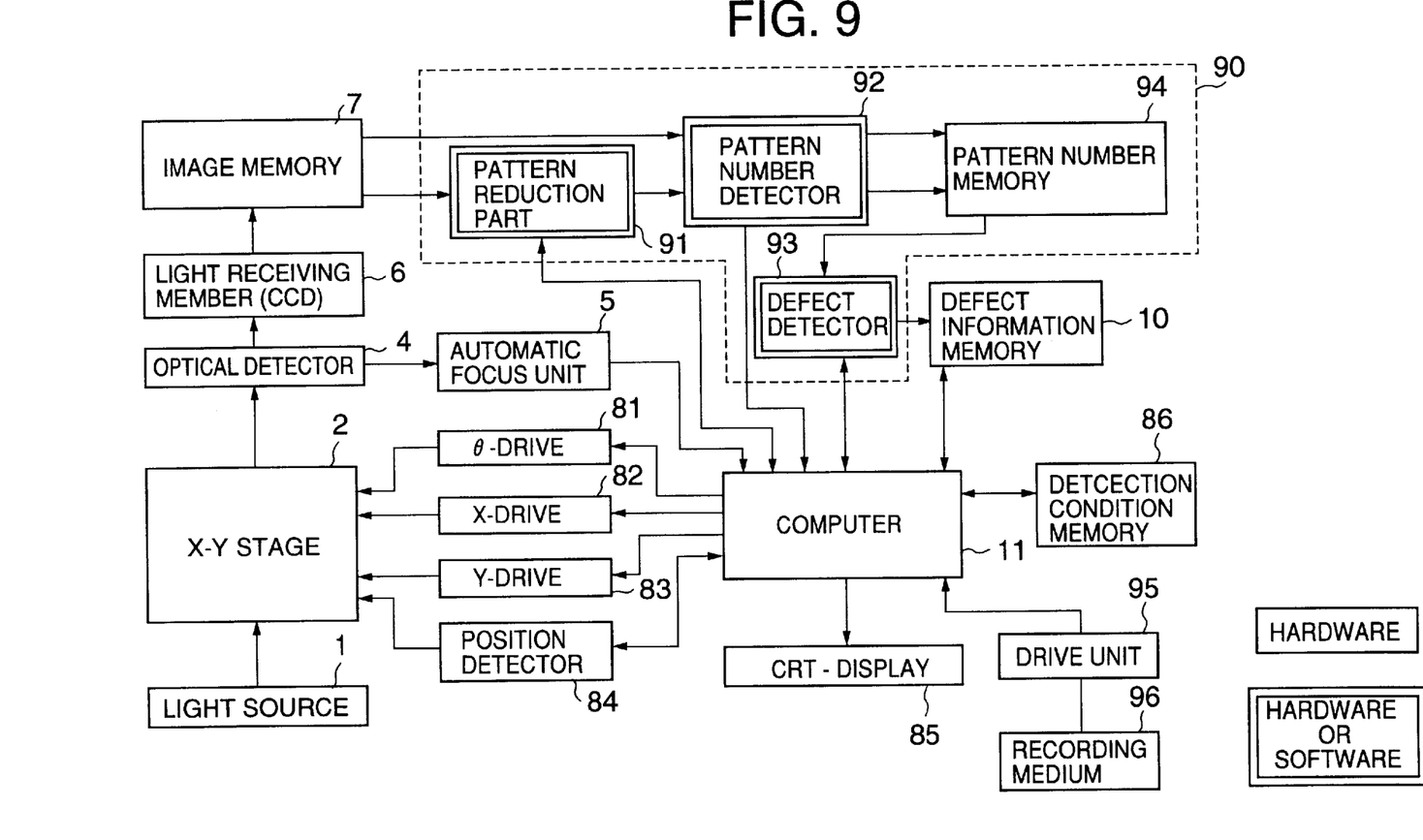
FIG. 9 is a block diagram of one embodiment of a pattern inspection apparatus of the present invention.

Next, a pattern inspection apparatus of the present invention and its operation will be described. FIG. 9 is a block diagram of one embodiment of the pattern inspection apparatus of the present invention.

The apparatus shown in FIG. 9 comprises the followings: a light source 1; an X-Y stage 2 on which a printed board or a photomask to be inspected is placed; an X-Y state position control unit made up of a θ driver 81, an X driver 82, a Y driver 83, and a position detector 84; an optical detector (an objective) 4 for detecting light emitted from the light source 1 and transmitted through the X-Y stage; an automatic focus part 5 for controlling the position of the optical detector 4; a light receiving member (a CCD) 6 for generating an electric signal from light supplied from the optical detector 4; an image memory 7 for generating image data from the stored electric signals generated by the light receiving member 6; a pattern reduction part 91 for reducing patterns contained in image data supplied from the image memory 7; a pattern number detector 92 for detecting the number of patterns in the image data prior to the pattern reduction and the number of patterns in the image data after the pattern reduction; a pattern number memory 94 for storing the number of patterns in the image data prior to the pattern reduction and the number of patterns in the image data after the pattern reduction; a defect detector 93 for detecting a defect by comparing the pattern numbers stored in the pattern number memory 94; a defect information memory 10 for storing information of the detected defect; an evaluation condition memory 86 for storing evaluation conditions; a display 85; and a computer 11 for controlling the entire operation of the apparatus.

The computer 11 detects the position of the X-Y stage 2 with the position detector 84, and controls the θ driver 81, the X driver 82, and the Y driver 83 to move the X-Y stage 2. The computer 11 also controls the automatic focus unit 5 to adjust the position of the optical detector 4.

In FIG. 9, the portion 90 surrounded by a dotted line embodies the features of the present invention, and either hardware or software can constitute the pattern reduction part 91, the pattern number detector 92, and the defect detector 93.

In the following, each of the blocks in FIG. 9 will be described more in detail. The light source 2 is situated under the X-Y stage 2, and light emitted from the light source 1 is transmitted through the X-Y stage 2 and supplied to the optical detector 4. The optical detector 4 adjusts the light and then outputs it to the light receiving member 6. The light receiving member 6 converts the light supplied from the optical detector 4 into an electric signal and stores it in the image memory 7.

The image memory 7 generates image data from the electric signal supplied from the light receiving member 6, and outputs the image data to the pattern reduction part 91 and the pattern number detector 92. The image data outputted from the image memory 7 may be as shown in FIG. 6A, for instance.

The pattern reduction part 91 reduces the patterns contained in the image data by a predetermined reduction width, and outputs the image data having the reduced patterns to the pattern number detector 92. The image data outputted from the pattern reduction part 91 may be as shown in FIG. 6B, for instance.

The pattern number detector 92 detects the number of patterns in the image data supplied from the image memory 7 and the number of patterns in the image data supplied from the pattern reduction part 91. The pattern number detector 92 then stores the number of patterns prior to the pattern reduction and the number of patterns after the pattern reduction in the pattern number memory 94.

The defect detector 93 compares the number of patterns in the image data prior to the pattern reduction with the number of patterns in the image data after the pattern reduction, and performs defect detection in accordance with the comparison result. More specifically, when the comparison result shows that the number of patterns after the pattern reduction is not equal to the number of patterns prior to the pattern reduction, the defect detector 93 determines that at least one defect is present in the inspected range, and stores the defect information in the defect information memory 10. The inspection information used in the pattern inspection in accordance with the present invention, such as the smallest pattern width, the reduction width, and the pattern inspection range, is stored in the inspection condition memory 86.

In a case where software is employed for the pattern reduction part 91, the pattern number detector 92, and the defect detector 93 in the pattern inspection apparatus of the present invention, a pattern inspection program is supplied from a recording medium 96. Various types of recording media can be employed as the recording medium 96. For instance, the recording medium 96 can be a magnetic recording medium in which information is magnetically recorded, such as CD-ROM, floppy disk, or magneto-optical disk, or a semiconductor memory in which information is electrically recorded, such as ROM or flash memory.

The recording medium 96 in which the pattern inspection program is recorded is set in a drive unit 95. The pattern inspection program is installed in a memory device (not shown) in the computer 11 via the drive unit 95. The computer 11 carries out the functions of the pattern reduction part 91, the pattern number detector 92, and the defect detector 93, following the pattern inspection program.

Figure 10:
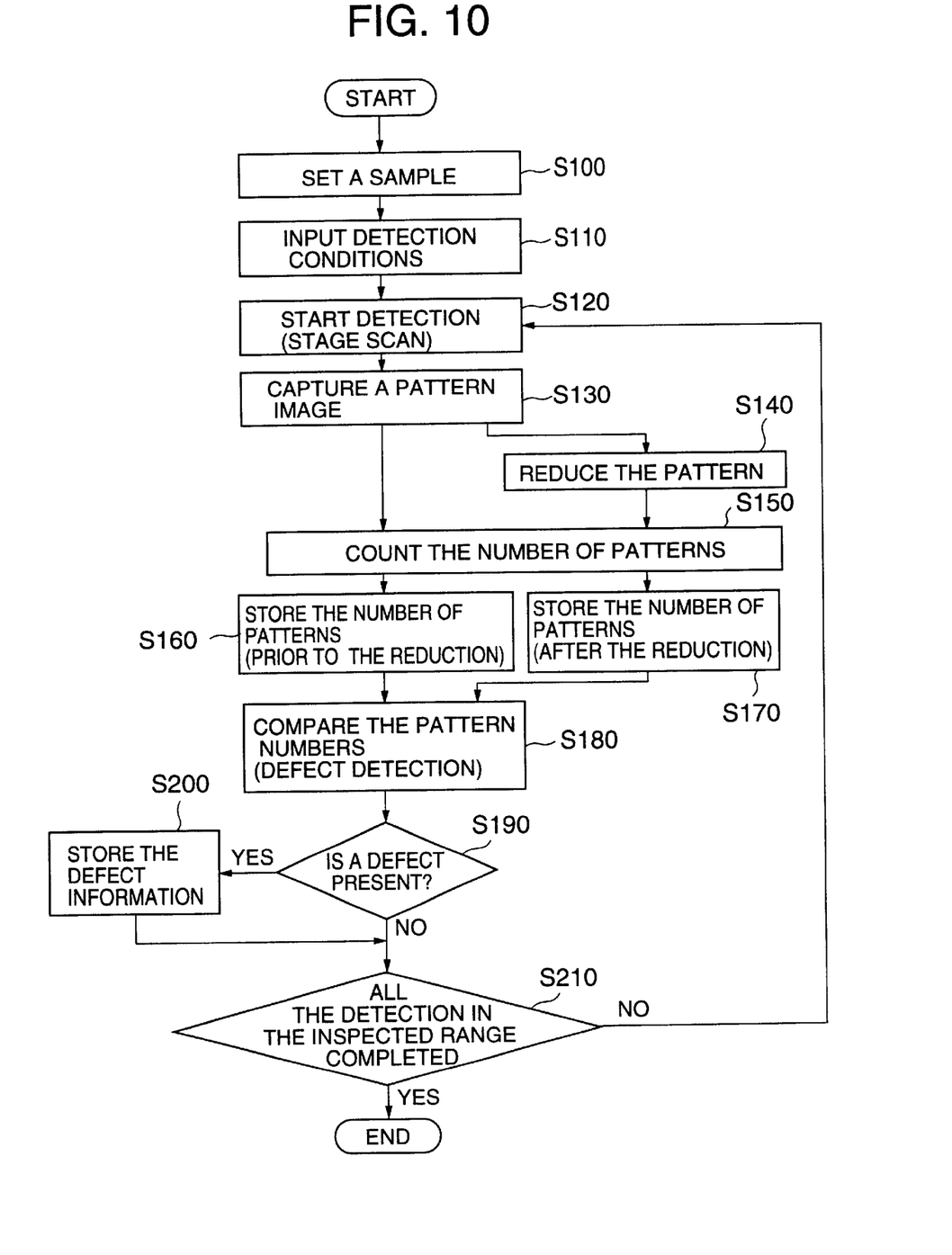
FIG. 10 is a flowchart of an operation of the pattern inspection apparatus of the present invention.

FIG. 10 is a flowchart of an operation procedure of the pattern inspection apparatus of the present invention.

In step S100, a sample (a chip) to be inspected, such as a printed board or a photomask, is placed on the X-Y stage 2. Inspection conditions required in the pattern inspection are then inputted in step S110. The inspection conditions are information to be used in the pattern inspection, such as the smallest pattern width, the reduction width, and the pattern inspection range. Here, the color of patterns to be inspected can be selected. In this embodiment, the black patterns are inspected.

In step S120, the computer 11 controls the θ driver 81, the X driver 82, and the Y driver 83 to adjust the position of the X-Y stage 2, and also controls the automatic focus unit 5 to adjust the position of the optical detector 4. Thus, light emitted from the light source 1 and transmitted through the chip placed on the X-Y stage 2 reaches the light receiving member 6.

In step S130, the light receiving member 6 converts the light into an electric signal, and stores it in the image memory 7. The image memory 7 then generates image data from the electric signal supplied from the light receiving member 6, and outputs the image data to the pattern reduction part 91 and the pattern number detector 92.

In step S140, the pattern reduction part 91 reduces the patterns contained in the image data by a predetermined reduction width, and outputs the image data containing the reduced patterns to the pattern number detector 92.

In step S150, the pattern number detector 92 detects the number of patterns in the image data supplied from the image memory 7 and the number of patterns in the image data supplied from the pattern reduction part 91. In step S160, the number of patterns in the image data prior to the pattern reduction and the number of patterns in the image data after the pattern reduction are stored in the pattern number memory 94.

In step S180, the defect detector 93 compares the number of patterns after the pattern reduction with the number of patterns prior to the pattern reduction stored in the pattern number memory 94. If the comparison result shows that the number of patterns after the pattern reduction is not equal to the number of patterns prior to the pattern reduction, the defect detector 93 determines that at least one defect is present in the inspected range.

If the defect detector 93 detects a defect in step S190, it stores the defect information in the defect information memory 10 in step S200, and the operation moves on to step S210. If the defect detector 93 determines no defects are present in the inspected range in the step S190, the operation moves on to the step S210.

In the step S210, whether all the patterns in the inspected range have been inspected is determined. If all the patterns in the inspected range have been inspected, the operation comes to an end. If not all the patterns in the inspected range have been inspected, the operation returns to the step S120.

As a modification of the above operation procedure, after steps equivalent to the steps S140 to S190 are carried out for the black patterns, the same steps are carried out for the white patterns, so that the black patterns and the white patterns are both inspected. As another modification, both the white patterns and the black patterns can be processed in the steps S140 to S190.

Although an optical detector that utilizes transmitted light is used in the above embodiments, an optical detector which utilizes reflected light can be employed. The image capture can also be performed by electron beam, for instance. The pattern reduction is not limited to the longitudinal and transverse directions, but patterns can be reduced in a diagonal direction.

The sides of pixels and image data are suitably determined based on the sizes of the patterns to be inspected. The present invention is applicable not only to printed boards and photomasks but also to LCD, PDP, and others.

The present invention is not limited to the specifically disclosed embodiments, but variations and modifications may be made without departing from the scope of the present invention.

What is claimed is:

1. A pattern inspection method comprising the steps of:
   generating first image data from a pattern image captured from a sample;
   obtaining a first pattern number which is the number of patterns contained in the first image data;
   generating second image data by reducing the four sides of each pattern contained in the first image data by a predetermined width;
   obtaining a second pattern number which is the number of patterns contained in the second image data; and
   detecting a defect in the patterns of the sample in accordance with a result of comparison between the first pattern number and the second pattern number.

2. The pattern inspection method as claimed in claim 1, wherein the step of detecting a defect includes the steps of:
   determining that no defect is present in the patterns of the sample when the comparison result shows that the second pattern number is equal to the first pattern number; and determining that at least one defect is present in the patterns of the sample when the comparison result shows that the second pattern number is not equal to the first pattern number.

3. The pattern inspection method as claimed in claim 1, wherein the step of detecting a defect includes the step of determining that at least one isolated defect is present in the patterns of the sample when the comparison result shows that the second pattern number is smaller than the first pattern number.

4. The pattern inspection method as claimed in claim 1, wherein the step of detecting a defect includes the step of determining that at least one short-circuit defect or edge defect is present in the sample when the comparison result shows that the second pattern number is larger than the first pattern number.

5. A pattern inspection apparatus comprising:
   a first image data generator which generates first image data from a pattern image captured from a sample;
   a second image data generator which generates second image data by reducing the four sides of each pattern contained in the first image data by a predetermined width;
   a pattern number detector which detects a first pattern number that is the number of patterns contained in the first image data, and which also detects a second pattern number that is the number of patterns contained in the second image data; and
   a defect detector which detects a defect present in the patterns of the sample in accordance with a result of comparison between the first pattern number and the second pattern number.

6. The pattern inspection apparatus as claimed in claim 5, wherein the defect detector determines that no defect is present in the pattern of the sample when the comparison result shows that the second pattern number is equal to the first pattern number, and determines that at least one defect is present in the patterns of the sample when the comparison result shows that the second pattern number is not equal to the first pattern number.

7. The pattern inspection apparatus as claimed in claim 5, wherein the defect detector determines that at least one isolated defect is present in the patterns of the sample when comparison result shows that the second pattern number is smaller than the first pattern number.

8. The pattern inspection apparatus as claimed in claim 5, wherein the defect detector determines that at least one short-circuit defect or edge defect is present in the patterns of the sample when the comparison result shows that the second pattern number is larger than the first pattern number.

9. A computer-readable recording medium in which a program is recorded, the program providing a computer with functions of:
   a first image data generator which generates first image data from a pattern image captured from a sample;
   a second image data generator which generates second image data by reducing the four sides of each pattern contained in the first image data by a predetermined width;
   a pattern number detector which detects a first pattern number that is the number of patterns contained in the first image data, and which also detects a second pattern number that is the number of patterns contained in the second image data; and
   a defect detector which detects a defect present in the patterns of the sample in accordance with a result of comparison between the first pattern number and the second pattern number.

* * * * *